United States Patent
Tsai et al.

(10) Patent No.: US 12,262,566 B2
(45) Date of Patent: Mar. 25, 2025

(54) OPTOELECTRONIC MODULE HAVING PROTRUDED AND RECESSED STRUCTURE FOR REDUCING OPTICAL CROSSTALK

(71) Applicant: Lite-On Technology Corporation, Taipei (TW)

(72) Inventors: Jui Lin Tsai, Taipei (TW); Chien Tien Wang, Taipei (TW); Shu-Hua Yang, Taipei (TW); Hsin Wei Tsai, Taipei (TW); You-Chen Yu, Taipei (TW)

(73) Assignee: Life-On Technology Corporation, Taipei (TW)

( * ) Notice: Subject to any disclaimer, the term of this patent is extended or adjusted under 35 U.S.C. 154(b) by 547 days.

(21) Appl. No.: 17/692,126

(22) Filed: Mar. 10, 2022

(65) Prior Publication Data

US 2022/0293813 A1     Sep. 15, 2022

Related U.S. Application Data

(60) Provisional application No. 63/188,475, filed on May 14, 2021, provisional application No. 63/159,994, filed on Mar. 12, 2021.

(30) Foreign Application Priority Data

Feb. 23, 2022   (CN) .......................... 202220375227.4

(51) Int. Cl.
*H10F 55/25*   (2025.01)
*H01L 25/16*   (2023.01)
*H10F 30/225*  (2025.01)
*H10F 77/40*   (2025.01)

(52) U.S. Cl.
CPC .......... *H10F 55/25* (2025.01); *H01L 25/167* (2013.01); *H01L 2924/12041* (2013.01); *H10F 30/225* (2025.01); *H10F 77/407* (2025.01)

(58) Field of Classification Search
CPC . H01L 31/167; H01L 31/107; H01L 31/0203; H01L 25/167; H01L 2924/12041; H10F 55/25; H10F 55/00
See application file for complete search history.

(56) References Cited

U.S. PATENT DOCUMENTS

| | | | |
|---|---|---|---|
| 10,720,545 B2 * | 7/2020 | Utsumi | H01L 33/52 |
| 11,688,815 B2 * | 6/2023 | Saxod | H01L 31/02327 257/82 |
| 2015/0028359 A1 * | 1/2015 | Tu | H01L 33/54 257/82 |

(Continued)

*Primary Examiner* — Alonzo Chambliss
(74) *Attorney, Agent, or Firm* — JCIPRNET

(57) ABSTRACT

An optoelectronic module, including a substrate, a covering member, a light emitting element, and a light receiving element, is provided. The covering member is disposed on the substrate and includes an upper cover portion, a peripheral sidewall portion connected to the upper cover portion, and an inside partition delimiting a first cavity and a second cavity. The first cavity is separated from the second cavity. The light emitting element is disposed on the substrate as corresponding to the first cavity. The light receiving element is disposed on the substrate as corresponding to the second cavity. The inside partition has a first inner wall surface located in the first cavity and a second inner wall surface located in the second cavity. A first protruded-recessed structure is formed on the first inner wall surface.

23 Claims, 9 Drawing Sheets

(56) References Cited

U.S. PATENT DOCUMENTS

| | | | |
|---|---|---|---|
| 2015/0243802 A1* | 8/2015 | Fujimoto | H10F 77/933 |
| | | | 257/82 |
| 2015/0279827 A1* | 10/2015 | Tu | H01L 31/167 |
| | | | 257/432 |
| 2017/0108357 A1* | 4/2017 | Chang | G01D 5/34 |
| 2018/0058920 A1* | 3/2018 | Saxod | H01L 31/0203 |
| 2018/0062003 A1* | 3/2018 | Luan | H01L 31/18 |
| 2018/0331236 A1* | 11/2018 | Luan | G01S 7/481 |
| 2018/0337104 A1* | 11/2018 | Sorrieul | G01S 7/4813 |
| 2019/0131481 A1* | 5/2019 | Pin | H01L 31/02325 |
| 2019/0139947 A1* | 5/2019 | Saxod | B29C 45/14754 |
| 2019/0288155 A1* | 9/2019 | Renard | G01S 7/4813 |
| 2020/0303565 A1* | 9/2020 | Saxod | H01L 21/565 |

* cited by examiner

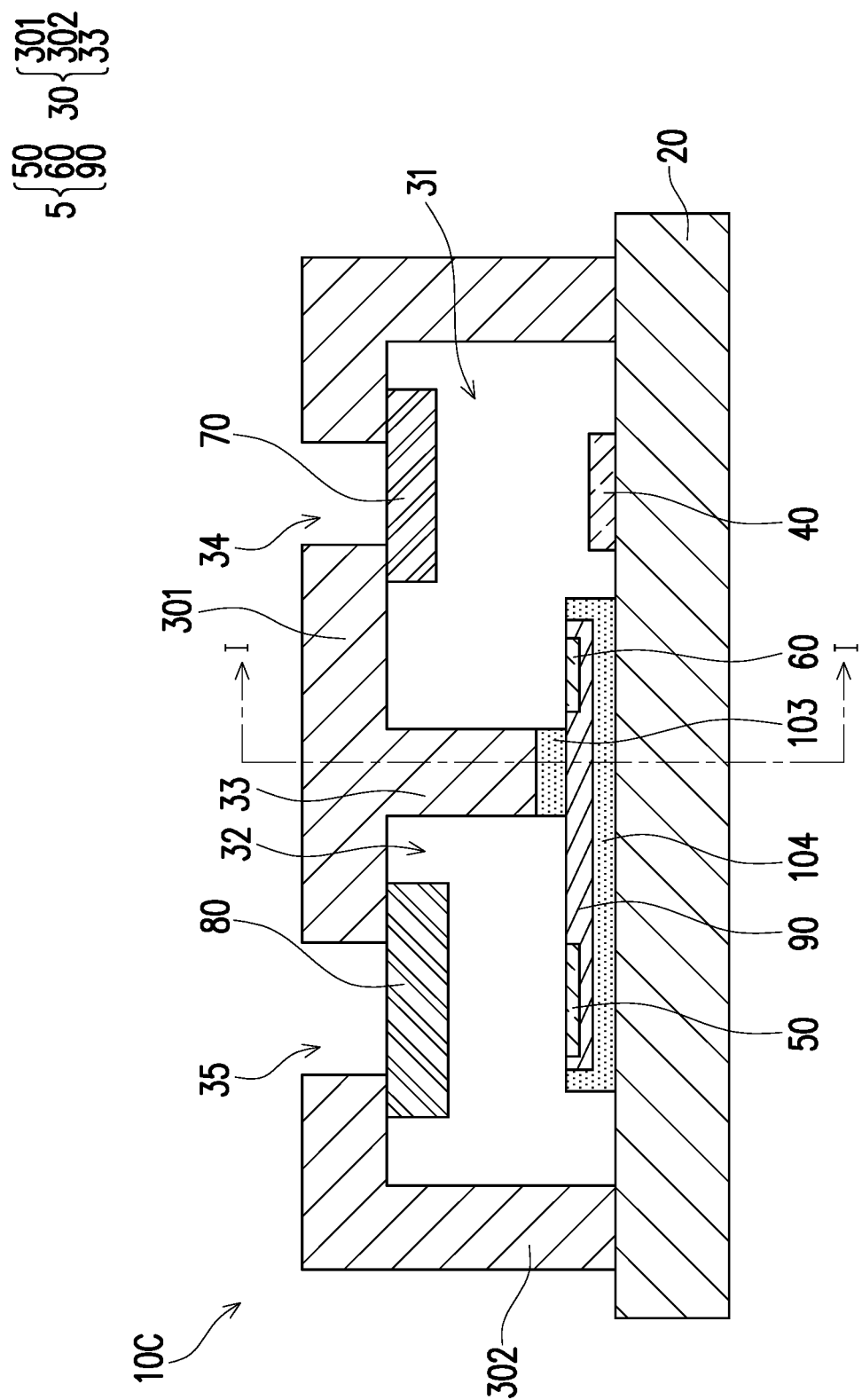

OPTOELECTRONIC MODULE HAVING PROTRUDED AND RECESSED STRUCTURE FOR REDUCING OPTICAL CROSSTALK

CROSS-REFERENCE TO RELATED APPLICATION

This application claims the priority benefit of U.S. Provisional Application No. 63/159,994, filed on Mar. 12, 2021, U.S. Provisional Application No. 63/188,475, filed on May 14, 2021 and Chinese application serial No. 202220375227.4, filed on Feb. 23, 2022. The entirety of each of the above-mentioned patent applications is hereby incorporated by reference herein and made a part of this specification.

BACKGROUND

Technical Field

The disclosure relates to a module, and in particular to an optoelectronic module.

Description of Related Art

The current three-dimensional sensing technology can be roughly divided into stereo vision, structured light, and time-of-flight (TOF). The stereo vision belongs to passive sensing technology, while the structured light and the time of flight belong to active sensing technology. Compared to the stereo vision, the structured light and the time-of-flight (TOF) have advantages such as low latency and high accuracy. On the other hand, compared to the structured light, the time-of-flight (TOF) has advantages such as simple operation, long sensing distance, low complexity, low cost, and less susceptible to external light interference, and has gradually become the mainstream technology for three-dimensional sensing.

However, in a conventional time of flight module, there is usually stray light, which causes the issues of optical crosstalk and signal-to-noise ratio reduction, thereby causing a decline in sensing accuracy. Therefore, the issues need to be solved.

SUMMARY

The disclosure provides an optoelectronic module with excellent sensing accuracy.

An optoelectronic module of the disclosure includes a substrate, a covering member, a light emitting element, and a light receiving element. The covering member is disposed on the substrate and includes an upper cover portion, a peripheral sidewall portion connected to the upper cover portion, and an inside partition delimiting a first cavity and a second cavity. The first cavity is separated from the second cavity. The light emitting element is disposed on the substrate as corresponding to the first cavity. The light receiving element is disposed on the substrate as corresponding to the second cavity. The inside partition has a first inner wall surface located in the first cavity and a second inner wall surface located in the second cavity. A first protruded-recessed structure is formed on the first inner wall surface.

In an embodiment of the disclosure, the second cavity is defined by at least the second inner wall surface, a third inner wall surface opposite to the second inner wall surface and a fourth inner wall surface connected between the second inner wall surface and the third inner wall surface. A second protruded-recessed structure is formed on at least one of the second inner wall surface, the third inner wall surface, and the fourth inner wall surface.

In an embodiment of the disclosure, the first cavity is defined by at least the first inner wall surface, a fifth inner wall surface opposite to the first inner wall surface and a sixth inner wall surface connected between the first inner wall surface and the fifth inner wall surface, and the fifth inner wall surface and the sixth inner wall surface are substantially smooth.

In an embodiment of the disclosure, the first inner wall surface, the second inner wall surface, the third inner wall surface, and the fifth inner wall surface are substantially perpendicular to the substrate, and the fourth inner wall surface and the sixth inner wall surface are substantially parallel to the substrate.

In an embodiment of the disclosure, the light receiving element is a single-photon avalanche diode (SPAD) sensor chip and includes a main optical sensor region and a reference optical sensor region. The main optical sensor region is located in the second cavity and is configured to receive light emitted by the light emitting element toward an external object and reflected toward the main optical sensor region. The reference optical sensor region is located in the first cavity and is disposed near the light emitting element.

In an embodiment of the disclosure, the inside partition includes a first section connecting the covering member and a second section located between the substrate and the first section, and a width of the first section is greater than a width of the second section.

In an embodiment of the disclosure, the first section includes a protruded portion extended outwardly and located in the first cavity. There is a gap between a bottom surface of the protruded portion and a top surface of the SPAD sensor chip, and the reference optical sensor region is within an orthographic projection area of the protruded portion on the substrate.

In an embodiment of the disclosure, the first protruded-recessed structure further includes a protruded portion located in the first cavity extending from the first inner wall surface of the inside partition. There is a gap between a bottom surface of the protruded portion and a top surface of the SPAD sensor chip, and the reference optical sensor region is within an orthographic projection area of the protruded portion on the substrate.

In an embodiment of the disclosure, at least a portion of end of the inside partition abuts against the SPAD sensor chip.

In an embodiment of the disclosure, the optoelectronic module further includes a first light shielding layer disposed between the inside partition and the SPAD sensor chip, and at least a portion of end of the inside partition is coupled to the SPAD sensor chip through the first light shielding layer.

In an embodiment of the disclosure, an end of the inside partition includes a recess facing the SPAD sensor chip, and the recess spans across the SPAD sensor chip to separate the main optical sensor region from the reference optical sensor region.

In an embodiment of the disclosure, the optoelectronic module further includes a second light shielding layer disposed between the inside partition, the SPAD sensor chip and the substrate, and a portion of the second light shielding layer is disposed in the recess.

In an embodiment of the present disclosure, the covering member includes a first opening communicated with the first cavity and a second opening communicated with the second cavity, and the optoelectronic module further includes a first optical element disposed in the first cavity and a second optical element disposed in the second cavity. The first optical element covers the first opening, and the second optical element covers the second opening.

In an embodiment of the disclosure, the optoelectronic module further includes a first radiation-filtering adhesive layer attached to the fourth inner wall surface and covering side edge surfaces of the second optical element.

In an embodiment of the disclosure, the second optical element includes a first optical surface facing the second opening and a second optical surface opposite to the first optical surface, and at least one of the first optical surface and the second optical surface is a Fresnel optical surface.

In an embodiment of the disclosure, one of the first optical surface and the second optical surface is a Fresnel optical surface, and other one of the first optical surface and the second optical surface includes an optical coating layer.

In an embodiment of the disclosure, the fourth inner wall surface and the sixth inner wall surface further includes a first groove and a second groove respectively. The first groove is communicated with the first opening, and the second groove is communicated with the second opening.

In an embodiment of the disclosure, the fourth inner wall surface and the sixth inner wall surface further includes a first glue accommodating groove and a second glue accommodating groove respectively. The first glue accommodating groove, the first opening and the first groove are separated through a first protrusion, and the second glue accommodating groove, the second opening and the second groove are separated through a second protrusion.

In an embodiment of the disclosure, the optoelectronic module further includes an adhesive layer disposed between the SPAD sensor chip and the substrate, and the SPAD sensor chip is bonded to the substrate through the adhesive layer. The adhesive layer is configured to block light in a specific wavelength range.

In an embodiment of the disclosure, the adhesive layer covers side edge surfaces of the SPAD sensor chip.

In an embodiment of the disclosure, the optoelectronic module further includes a second radiation-filtering adhesive layer disposed on the substrate and covering side edge surfaces of the SPAD sensor chip and side edge surfaces of the adhesive layer.

An optoelectronic module of the disclosure includes a substrate, a covering member, a light emitting element, and a light receiving element. The covering member is disposed on the substrate and includes an inside partition delimiting a first cavity and a second cavity. The light emitting element is disposed on the substrate as corresponding to the first cavity. The light receiving element is disposed on the substrate as corresponding to the second cavity. The inside partition has a first inner wall surface located in the first cavity and a second inner wall surface located in the second cavity. The second cavity is defined by at least the second inner wall surface, a third inner wall surface opposite to the second inner wall surface, a fourth inner wall surface connected between the second inner wall surface and the third inner wall surface. A second protruded-recessed structure is formed on at least one of the second inner wall surface, the third inner wall surface and the fourth inner wall surface.

Based on the above, the second protruded-recessed structure is formed on at least a portion of the inner wall surfaces of the second cavity, which can prevent stray light from being received by the light receiving element/the main optical sensor region after being reflected by the at least a portion of the inner wall surfaces, thereby avoiding signal-to-noise ratio reduction. On the other hand, the second cavity where the light receiving element/the main optical sensor region is located and the first cavity where the light emitting element is located are separated by the inside partition. The first protruded-recessed structure is formed on the first inner wall surface of the inside partition located in the first cavity, which can prevent stray light from penetrating the inside partition from the first cavity where the light emitting element is located to enter the second cavity where the light receiving element/the main optical sensor region is located, thereby reducing optical crosstalk. Therefore, the optoelectronic module of the disclosure has excellent sensing accuracy.

In order for the features and advantages of the disclosure to be more comprehensible, the following specific embodiments are described in detail in conjunction with the drawings.

BRIEF DESCRIPTION OF THE DRAWINGS

FIG. 4A is a schematic cross-sectional view of an optoelectronic module according to yet another embodiment of the disclosure.

DETAILED DESCRIPTION OF DISCLOSED EMBODIMENTS

Figure 1A:
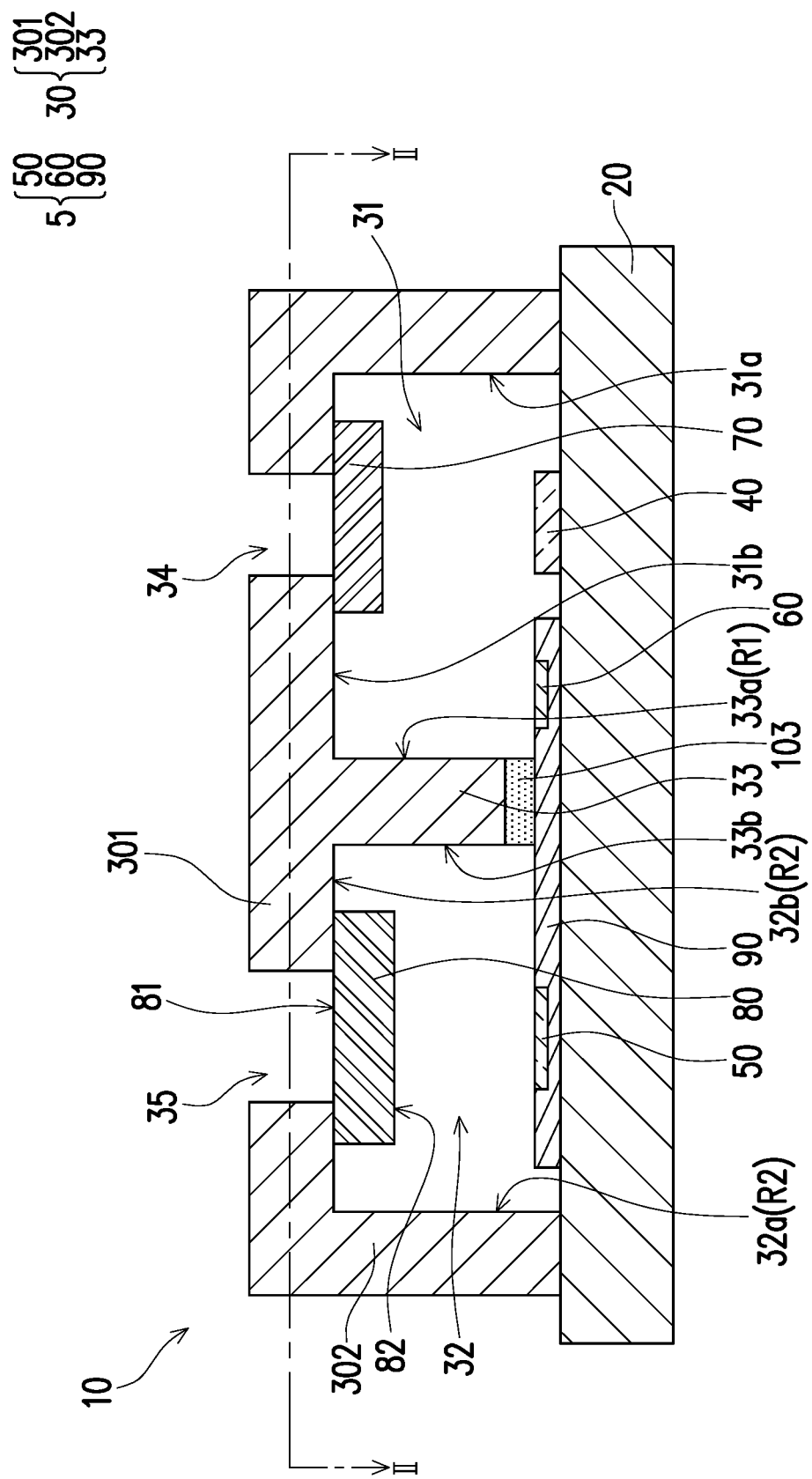
FIG. 1A is a schematic cross-sectional view of an optoelectronic module according to an embodiment of the disclosure.

FIG. 1A is a schematic cross-sectional view of an optoelectronic module according to an embodiment of the disclosure. Please refer to FIG. 1A, in the embodiment, an optoelectronic module 10 may be an optical ranging module. For example, the optical ranging module may be a time-of-flight (TOF) module or a proximity sensor. The optoelectronic module 10 includes a substrate 20, a covering member 30, a light emitting element 40, and a light receiving element 5.

In detail, the covering member 30, the light emitting element 40, and the light receiving element 5 are disposed on the substrate 20, and the covering member 30 covers at least a portion of the substrate 20, the light emitting element 40 and the light receiving element 5. The covering member 30 includes an upper cover portion 301, a peripheral sidewall portion 302, and an inside partition 33. The upper cover portion 301 is connected to the peripheral sidewall portion 302 and the inside partition 33, wherein the upper cover portion 301 is substantially parallel to the substrate 20, and the peripheral sidewall 1 portion 302 and the inside partition 33 are substantially perpendicular to the substrate 20, wherein the inside partition 33 delimits a first cavity 31 and a second cavity 32. That is, the upper cover portion 301, the peripheral sidewall portion 302, and the inside partition 33 jointly define the first cavity 31 and the second cavity 32, and the inside partition 33 is located between the first cavity 31 and the second cavity 32 to separate the first cavity 31 from the second cavity 32. The light emitting element 40 is disposed in the first cavity 31 and is configured to emit light with a wavelength toward an external object. The light receiving element 5 is mainly disposed in the second cavity 32 and is configured to receive and detect light reflected by the external object.

In the disclosure, the light emitting element 40 can be implemented, for example, as an infrared (IR) light emitting diode (LED), laser diode or vertical cavity surface emitting laser (VCSEL). Other types of light emitting elements may be used for some implementations. In some cases, the light emitting element may emit light at wavelengths different from IR. The light receiving element 5 may be a photo detector (PD) or a single-photon avalanche diode (SPAD) sensor chip, but not limited thereto. The embodiment takes the SPAD sensor chip as an example. The SPAD sensor chip 90 is made of a semiconductor material (e.g., silicon). The SPAD sensor chip 90 includes one or more electrical components (e.g., an integrated circuit). The integrated circuit may be an analog or digital circuit. Specifically, the SPAD sensor chip 90 includes the electrical components forming an application specific integrated circuit (ASIC). Accordingly, as commonly known by persons skilled in the art, the SPAD sensor chip 90 includes circuits for transmitting, receiving, and analyzing electrical signals.

Please refer to FIG. 1A, in the embodiment, the SPAD sensor chip 90 includes a main optical sensor region 50, which may be formed in the upper surface of the SPAD sensor chip 90 or coupled to the upper surface of the SPAD sensor chip 90 in other manners. The main optical sensor region 50 may be or include an array of light sensing elements, such as an array of photodiodes, an array of single-photon avalanche diodes (SPADs) or the like configured to detect the reflected light from the external object. In other embodiments, the SPAD sensor chip 90 further includes a reference optical sensor region 60 in addition to the main optical sensor region 50. The reference optical sensor region 60 may be formed in the upper surface of the SPAD sensor chip 90 or coupled to the upper surface of the SPAD sensor chip 90 in other manners. The reference optical sensor region 60 is positioned near the light emitting element 40 and is configured to receive reference light emission, such as light emitted by the light emitting element 40 and reflected back to the reference optical sensor region 60 by a nearby surface (e.g., an inner wall surface of the upper cover portion 301) with a known distance or optical path length. A reference optical sensor circuit (not shown) is formed in the SPAD sensor chip 90 near the reference optical sensor region 60 to process a signal generated by the reference optical sensor region 60 when a reflected reference light is received.

As shown in FIG. 1A, the light emitting element 40 and the reference optical sensor region 60 are disposed in the first cavity 31, and the main optical sensor region 50 is disposed in the second cavity 32. In other words, the inside partition 33 separates the light emitting element 40 from the main optical sensor region 50. Correspondingly, the inside partition 33 separates the reference optical sensor region 60 from the main optical sensor region 50 to prevent optical crosstalk. Light emitted by the light emitting element 40 is irradiated to the external object, then reflected toward the main optical sensor region 50, and sensed by the main optical sensor region 50 and processed by the SPAD sensor chip 90 to obtain, for example, distance data to the external object or depth data of the external object.

In the embodiment, the covering member 30 includes a first opening 34 communicated with the first cavity 31 and a second opening 35 communicated with the second cavity 32, wherein the light emitting element 40 is arranged corresponding to the first opening 34, and the main optical sensor region 50 is arranged corresponding to the second opening 35. The light, such as infrared light, emitted by the light emitting element 40 is projected from the first cavity 31 to the outside through the first opening 34, and the infrared light reflected by the external object is incident into the second cavity 32 through the second opening 35 to be received by the main optical sensor region 50. In detail, the optoelectronic module 10 further includes a first optical element 70 disposed in the first cavity 31 and a second optical element 80 disposed in the second cavity 32, wherein the first optical element 70 is, for example, a diffuser or a diffractive optical element (DOE) and covers the first opening 34. The second optical element 80 is, for example, a lens, Fresnel lens or a filter element and covers the second opening 35. Therefore, the light emitted by the light emitting element 40 may pass through the first optical element 70 to form light rays with a uniform intensity distribution and a specific distribution. Additionally, the light reflected by the external object back into the second cavity 32 may pass through the second optical element 80 to be focused on and received by the main optical sensor region 50.

Figure 1B:
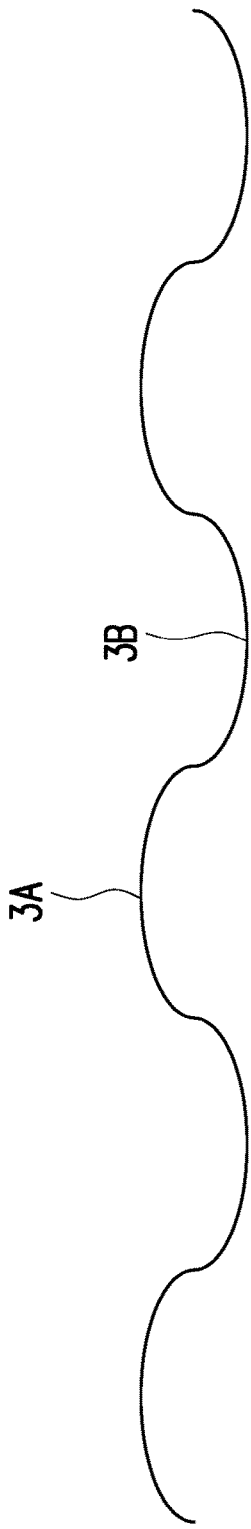
FIG. 1B to FIG. 1D are schematic structural views of different implementations of an inner wall surface of a first cavity or a second cavity in FIG. 1A.
Figure 1C:
Figure 1D:
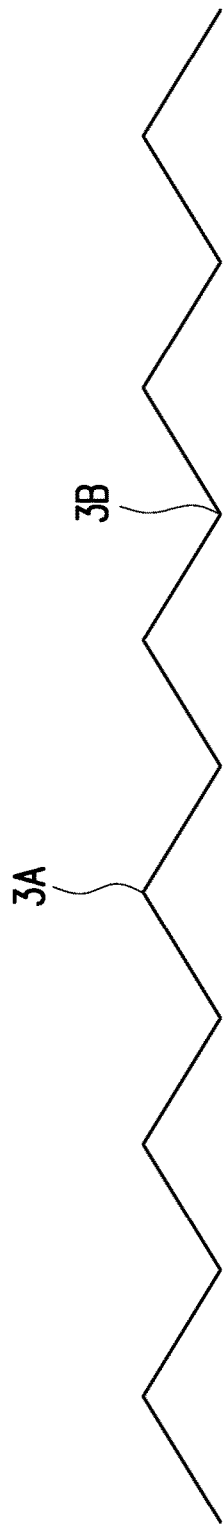

FIG. 1B to FIG. 1D are schematic structural views of different implementations of an inner wall surface of a first cavity or a second cavity in FIG. 1A. Please refer to FIG. 1A, in the embodiment, the inside partition 33 has a first inner wall surface 33a located in the first cavity 31 and a second inner wall surface 33b located in the second cavity 32. A first protruded-recessed structure R1 is formed on the first inner wall surface 33a, wherein the first protruded-recessed structure R1 includes at least one protruded portion or recessed portion. That is, the first inner wall surface 33a is not a substantially flat and smooth surface. For example, the first protruded-recessed structure R1 has a plurality of protruded portions and a plurality of recessed portions existing in the first inner wall surface 33a, which may be a stepped structure, an embossing, a microstructure, or a roughened structure after surface roughening processing (by a mechanical method or a chemical method) to prevent stray light from passing through the inside partition 33 from the first cavity 31 to enter the second cavity 32, which can avoid the problems of optical crosstalk and signal-to-noise ratio reduction. Therefore, the optoelectronic module 10 has excellent sensing accuracy. For example, for the form of the first protruded-recessed structure R1 of the first inner wall surface 33a, reference may be made to FIG. 1B to FIG. 1D. As can be seen from the drawings, the first protruded-recessed structure R1 may include protruded portions 3A and recessed portions 3B, and the number and the structural form thereof are not limited thereto.

In addition, please refer to FIG. 1A, taken along line II-II of FIG. 1A, the second cavity 32 is defined by the second inner wall surface 33b, a third inner wall surface 32a opposite to the second inner wall surface 33b, a fourth inner wall surface 32b and a surface of the substrate 20 facing the fourth inner wall surface 32b and located between the second inner wall surface 33b and the third inner wall surface 32a, wherein the fourth inner wall surface 32b facing the main optical sensor region 50 is connected between the second inner wall surface 33b and the third inner wall surface 32a. A second protruded-recessed structure R2 is formed on at least one of the second inner wall surface 33b, the third inner wall surface 32a, and the fourth inner wall surface 32b, wherein the second protruded-recessed structure R2 includes at least one protruded portion or recessed portion. In the embodiment, preferably, the second protruded-recessed structure R2 has a plurality of protruded portions and a plurality of recessed portions existing in at least one the inner wall surface (e.g., the second inner wall surface 33b, third inner wall surface 32a, or fourth inner wall surface 32b), which may be, for example, a stepped structure, an embossing, a microstructure, or a roughened structure after surface roughening processing (by a mechanical method or a chemical method) to prevent stray light from being reflected by the inner wall surface of the second cavity 32 to be incident into the main optical sensor region 50, which can avoid the problem of the stray light being received by the main optical sensor region 50 and reduce signal noise. Therefore, the optoelectronic module 10 has excellent sensing accuracy. For example, for the form of the second protruded-recessed structure R2 of at least one of the second inner wall surface 33b, the third inner wall surface 32a, and the fourth inner wall surface 32b, reference may be made to FIG. 1B to FIG. 1D. As can be seen from the drawings, the second protruded-recessed structure R2 may include protruded portions 3A and recessed portions 3B, and the number and the structural form thereof are not limited thereto.

Please refer to FIG. 1A, taken along line II-II of FIG. 1A, the first cavity 31 is defined by the first inner wall surface 33a, a fifth inner wall surface 31a opposite to the first inner wall surface 33a, a sixth inner wall surface 31b and a surface of the substrate 20 facing the sixth inner wall surface 31b and located between the first inner wall surface 33a and the fifth inner wall surface 31a, wherein the sixth inner wall surface 31b facing the light emitting element 40 is connected between the first inner wall surface 33a and the fifth inner wall surface 31a. In the embodiment, relative to the first inner wall surface 33a, the fifth inner wall surface 31a and the sixth inner wall surface 31b are substantially smooth. Further, the first inner wall surface 33a, the second inner wall surface 33b, the third inner wall surface 32a, and the fifth inner wall surface 31a are substantially perpendicular to the substrate 20, and the fourth inner wall surface 32b and the sixth inner wall surface 31b are substantially parallel to the substrate 20. On the other hand, the first opening 34 penetrates the sixth inner wall surface 31b, and the first optical element 70 is attached to the sixth inner wall surface 31b. The second opening 35 passes through the fourth inner wall surface 32b, and the second optical element 80 is attached to the fourth inner wall surface 32b. In the embodiment, the second optical element 80 has a first optical surface 81 facing the second opening 35 and a second optical surface 82 opposite to the first optical surface 81, and at least one of the first optical surface 81 and the second optical surface 82 is a focusing lens, a Fresnel optical surface, or an optical surface with microstructure. In an embodiment, the first optical surface 81 and the second optical surface 82 are both Fresnel optical surfaces. In another embodiment, the first optical surface 81 is a Fresnel optical surface, and the second optical surface 82 further includes an optical coating layer. Alternatively, in yet another embodiment, the first optical surface 81 includes an optical coating layer, and the second optical surface 82 is a Fresnel optical surface to improve transmittance or block light rays in a specific wavelength band from entering the second cavity 32.

Please refer to FIG. 1A, the SPAD sensor chip 90 disposed on the substrate 20 extends from the second cavity 32 to the first cavity 31, and the main optical sensor region 50 and the reference optical sensor region 60 thereon are respectively located in the second cavity 32 and the first cavity 31. In detail, the inside partition 33 of the covering member 30 extends from the upper cover portion 301 (i.e., from the interface between the fourth inner wall surface 32b and the sixth inner wall surface 31b) to the substrate 20, and the inside partition 33 passes locally above the SPAD sensor chip 90 (i.e., a portion of the end of the inside partition 33 is located above the top surface of the SPAD sensor chip 90) to separate the main optical sensor region 50 from the reference optical sensor region 60. On the other hand, the optoelectronic module 10 further includes a first light shielding layer 103 disposed between the inside partition 33 and the SPAD sensor chip 90, and at least a portion of the end of the inside partition 33 may be bonded to the SPAD sensor chip 90 through the first light shielding layer 103. In the embodiment, the first light shielding layer 103 may be, for example, an opaque glue, an opaque epoxy, an opaque tape, or opaque foam to prevent stray light from entering the second cavity 32 through a seam between the inside partition 33 and the SPAD sensor chip 90, which can avoid the stray light being received by the main optical sensor region 50 to reduce optical crosstalk. On the other hand, the first light shielding layer 103 may also serve as a buffer to prevent the top surface of the SPAD sensor chip 90 from being crushed by the inside partition 33 during the process of assembling the covering member 30.

Figure 2:
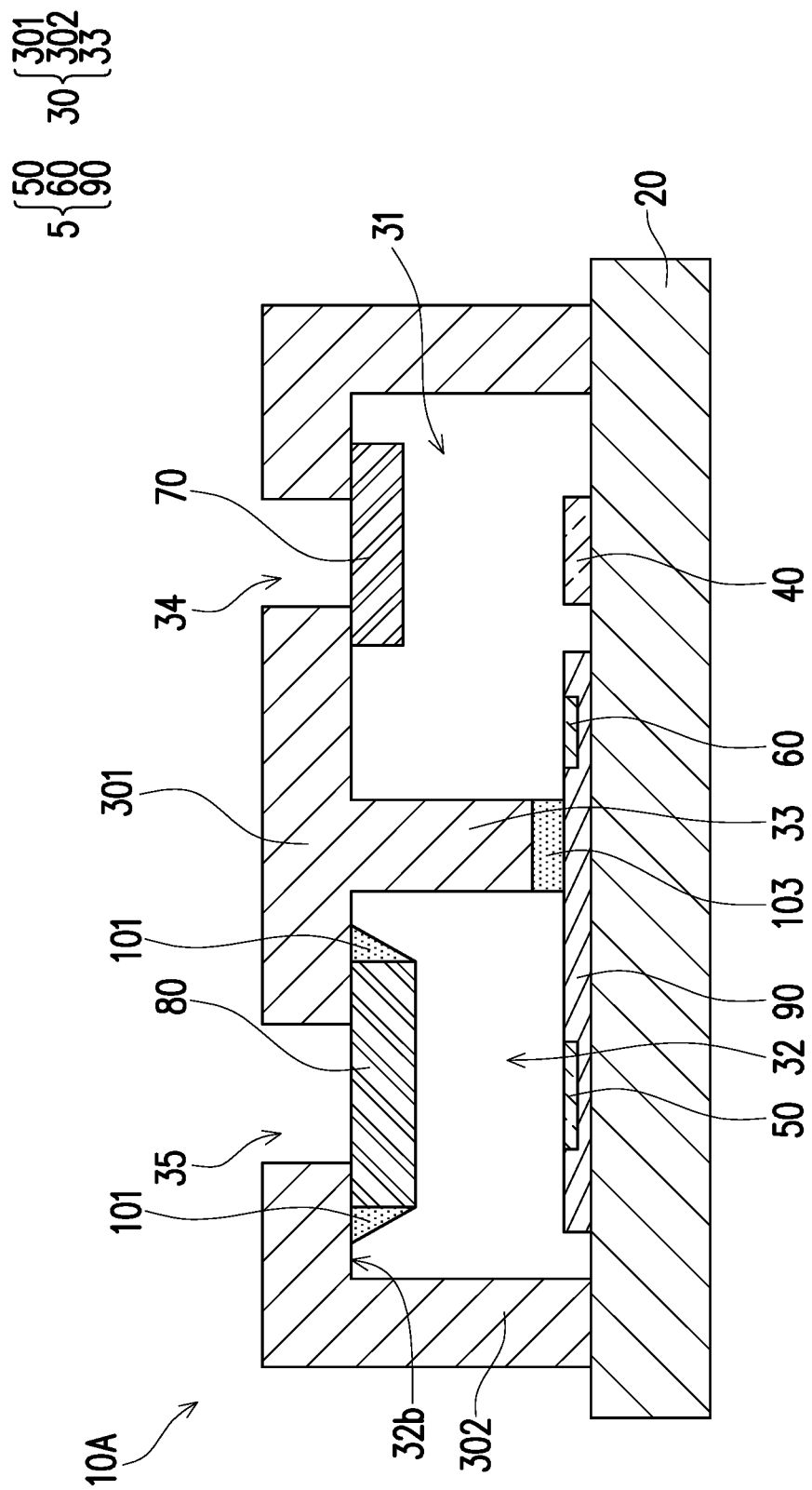
FIG. 2 is a schematic cross-sectional view of an optoelectronic module according to another embodiment of the disclosure.

FIG. 2 is a schematic cross-sectional view of an optoelectronic module according to another embodiment of the disclosure. Please refer to FIG. 2, an optoelectronic module 10A of the embodiment has substantially the same design as the optoelectronic module 10 shown in FIG. 1A, and the difference between the two is that the optoelectronic module 10A further includes a first radiation-filtering adhesive layer 101, wherein the first radiation-filtering adhesive layer 101 can filter out a specific wavelength band. The first radiation-filtering adhesive layer 101 is attached to the fourth inner wall surface 32b around the side edge surfaces of the second optical element 80. More in detail, the side edge surfaces of the second optical element 80 are covered by the first radiation-filtering adhesive layer 101, wherein the first radiation-filtering adhesive layer 101 may be configured to block or absorb light in a specific wavelength range, such as infrared light, to prevent stray light from entering the second cavity 32 through the edge of the second optical element 80 or a seam between the second optical element 80 and the fourth inner wall surface 32b, which greatly reduces the stray light being received by the main optical sensor region 50.

Figure 3:
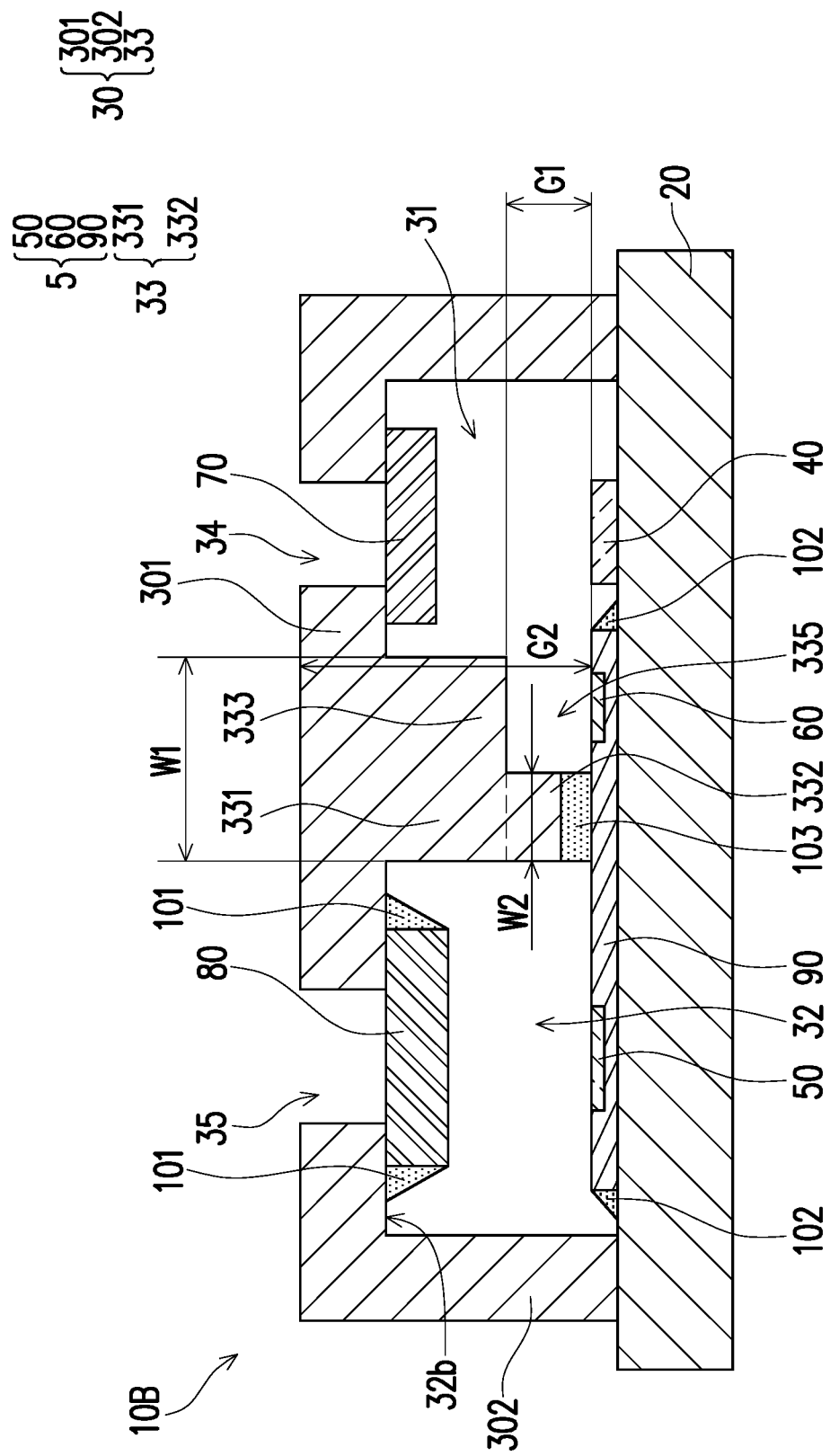
FIG. 3 is a schematic cross-sectional view of an optoelectronic module according to yet another embodiment of the disclosure.

FIG. 3 is a schematic cross-sectional view of an optoelectronic module according to yet another embodiment of the disclosure. Please refer to FIG. 3, an optoelectronic module 10B of the embodiment has substantially the same design as the optoelectronic module 10A shown in FIG. 2, and the difference between the two is that the optoelectronic module 10B further includes a second radiation-filtering adhesive layer 102, wherein the second radiation-filtering adhesive layer 102 can filter out a specific wavelength band. The second radiation-filtering adhesive layer 102 is disposed on the substrate 20 around the side edge surfaces of the SPAD sensor chip 90. More in detail, the side edge surfaces of the SPAD sensor chip 90 are covered by the second radiation-filtering adhesive layer 102, wherein the second radiation-filtering adhesive layer 102 may be configured to block or absorb light in a specific wavelength range, such as infrared light, to prevent stray light from entering through the edge of the SPAD sensor chip 90 or a seam between the SPAD sensor chip 90 and the substrate 20, which reduces the stray light received by the main optical sensor region 50 to greatly reduce optical crosstalk without affecting the signal-to-noise ratio.

On the other hand, the inside partition 33 includes a first section 331 connecting the upper cover portion 301 and a second section 332 located between the substrate 20 and the first section 331, and a width W1 of the first section 331 is greater than a width W2 of the second section 332. In detail, the first section 331 includes a protruded portion 333 extended outwardly and located in the first cavity 31 (relative to the first section 331, the second section 332 includes a recessed portion 335 recessed inwardly and located in the first cavity 31), that is, the first section 331 and the second section 332 constitute the first protruded-recessed structure R1. There is a gap G1 between the bottom surface of the protruded portion 333 and the top surface of the SPAD sensor chip 90. Further, the reference optical sensor region 60 is within an orthographic projection area of the protruded portion 333 on the substrate 20. Therefore, the protruded portion 333 of the first section 331 may block stray light from entering the reference optical sensor region 60, which prevents the stray light from being received by the reference optical sensor region 60 to improve the sensing accuracy. For example, the proportional relationship between the width W1 of the first section 331 and the width W2 of the second section 332 is W2<W1≤2W2, and the width W2 is greater than or equal to 0.15 mm. In addition, there is a gap G2 between the top surface of the upper cover portion 301 and the top surface of the SPAD sensor chip 90, and the proportional relationship between the gap G1 and the gap G2 is 1/3G2≤G1≤1/2G2.

FIG. 4A is a schematic cross-sectional view of an optoelectronic module according to yet another embodiment of the disclosure. Please refer to FIG. 4A, an optoelectronic module 10C of the embodiment has substantially the same design as the optoelectronic module 10 shown in FIG. 1A, and the difference between the two is that the optoelectronic module 10C further includes an adhesive layer 104 disposed between the substrate 20 and the SPAD sensor chip 90 and further surrounding the side surfaces of the SPAD sensor chip 90, wherein the adhesive layer 104 may be made of, for example, a glue with radiation-isolation feature for blocking light in a specific wavelength range, such as infrared light, and further covers the side surfaces of the SPAD sensor chip 90 to prevent stray light from entering through the side edge of the SPAD sensor chip 90 or the seam between the SPAD sensor chip 90 and the substrate 20, which avoid the stray light being received by the main optical sensor region 50. In sum, the SPAD sensor chip 90 may not only be bonded to the substrate 20 through the adhesive layer 104, but may also greatly reduce the chance of optical crosstalk through the adhesive layer 104.

Figure 4B:
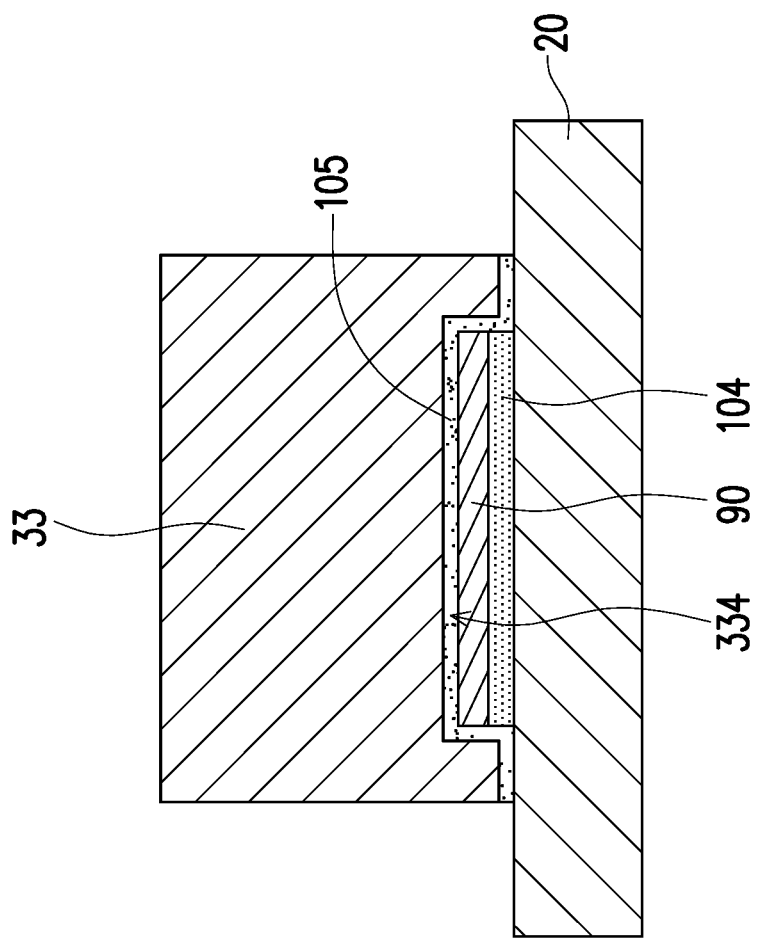
FIG. 4B is a schematic cross-sectional view taken along line I-I of FIG. 4A.

FIG. 4B is a schematic cross-sectional view taken along line I-I of FIG. 4A. Please refer to FIGS. 4A and 4B, the end of the inside partition 33 includes a recess 334 facing the SPAD sensor chip 90 and adjacent to the top surface thereof, so that the inside partition 33 may span across the SPAD sensor chip 90 to be bonded to the substrate 20. In addition, the optoelectronic module 10C may further includes a second light shielding layer 105 disposed between the inside partition 33 and the substrate 20 and the SPAD sensor chip 90, wherein the second light shielding layer 105 may be made of, for example, a glue with radiation-isolation feature for blocking light in a specific wavelength range, such as infrared light. In the embodiment, the recess 334 may provide an increased volume for accommodating the flow of the second light shielding layer 105, thereby enhancing the coupling force. In sum, a portion of the second light shielding layer 105 is disposed in the recess 334, so that the recess 334 of the inside partition 33 may be bonded to a non-functional region of the top surface of the SPAD sensor chip 90 through the second light shielding layer 105. Similarly, the portion of the second light shielding layer 105 may also serve as a buffer to prevent the top surface of the SPAD sensor chip 90 from being crushed by the inside partition 33 during the process of assembling the covering member 30. Another portion of the second light shielding layer 105 is located outside the recess 334, and the end edges of the inside partition 33 are bonded to the substrate 20 through the second light shielding layer 105. In other words, the second light shielding layer 105 can prevent stray light from entering the second cavity 32 through the seam between the inside partition 33 and the SPAD sensor chip 90 and a seam between the inside partition 33 and the substrate 20 in addition to closely fitting the end of the division portion 33 to the SPAD sensor chip 90 and the substrate 20, which can avoid the stray light being received by the main optical sensor region 50.

Figure 5:
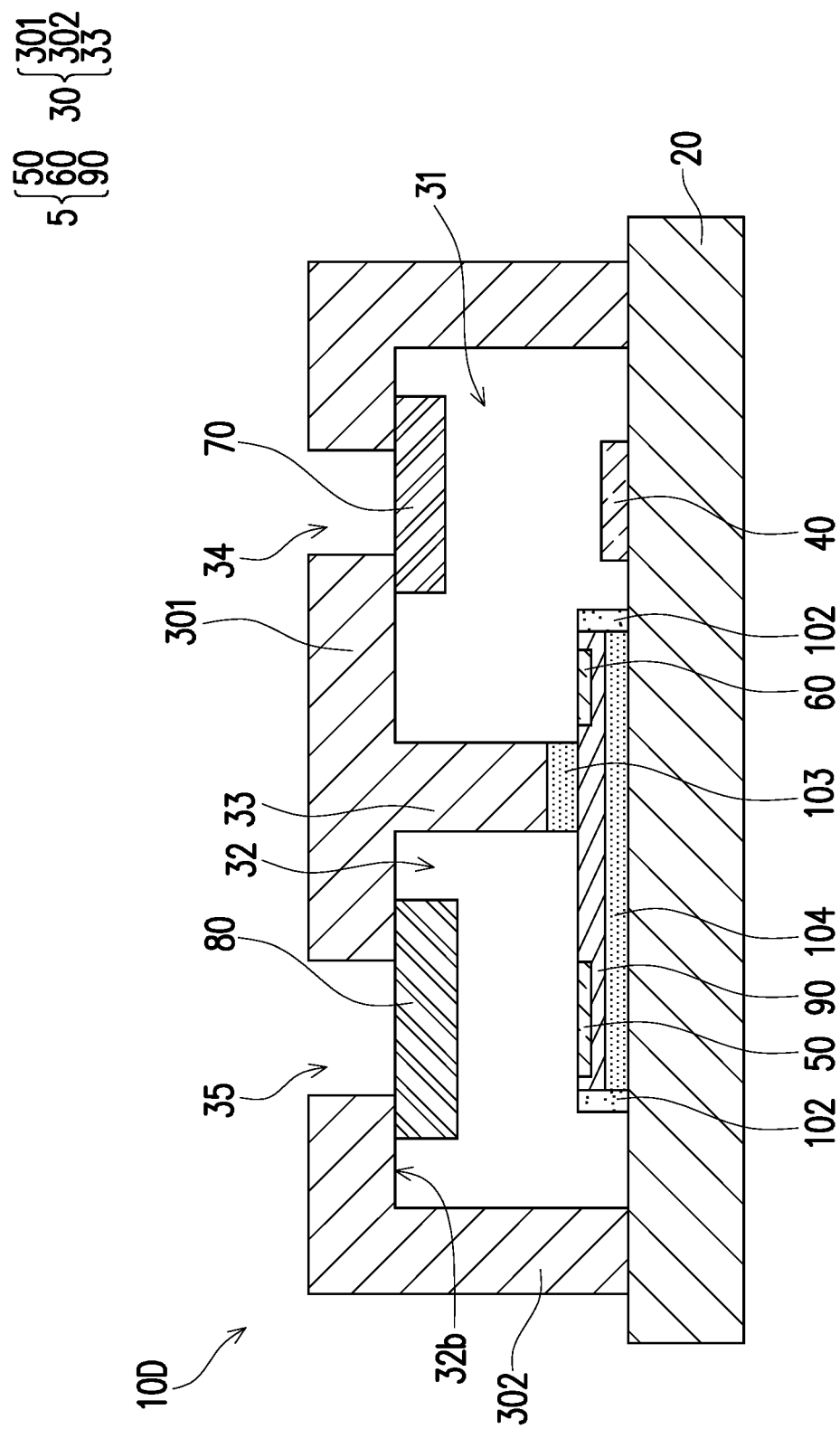
FIG. 5 is a schematic cross-sectional view of an optoelectronic module according to still another embodiment of the disclosure.

FIG. 5 is a schematic cross-sectional view of an optoelectronic module according to still another embodiment of the disclosure. Please refer to FIG. 5, an optoelectronic module 10D of the embodiment has substantially the same design as the optoelectronic module 10C shown in FIG. 4A, and the difference between the two is that the optoelectronic module 10D further includes a second radiation-filtering adhesive layer 102 disposed on the substrate 20 and covering the side edge surfaces of the SPAD sensor chip 90 and the side edge surfaces of the adhesive layer 104. In detail, the second radiation-filtering adhesive layer 102 can filter out a specific wavelength band, which may be made of a glue with radiation-isolation feature for blocking or absorbing light in a specific wavelength range, such as infrared light, to prevent stray light from entering the second cavity 32 through the edge of the SPAD sensor chip 90, the seam between the SPAD sensor chip 90 and the substrate 20, or the adhesive layer 104, which can avoid the stray light being received by the main optical sensor region 50.

Figure 6A:
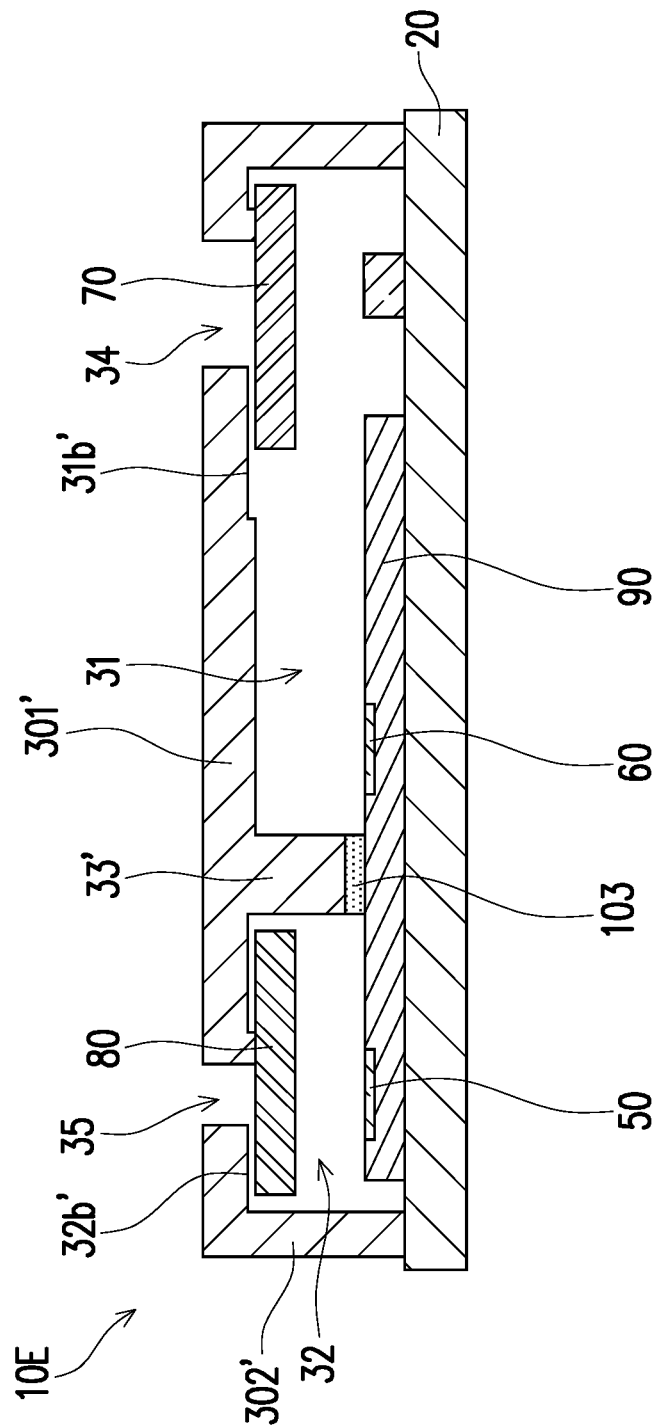
FIG. 6A is a schematic cross-sectional view of an optoelectronic module according to yet another embodiment of the disclosure.
Figure 6B:
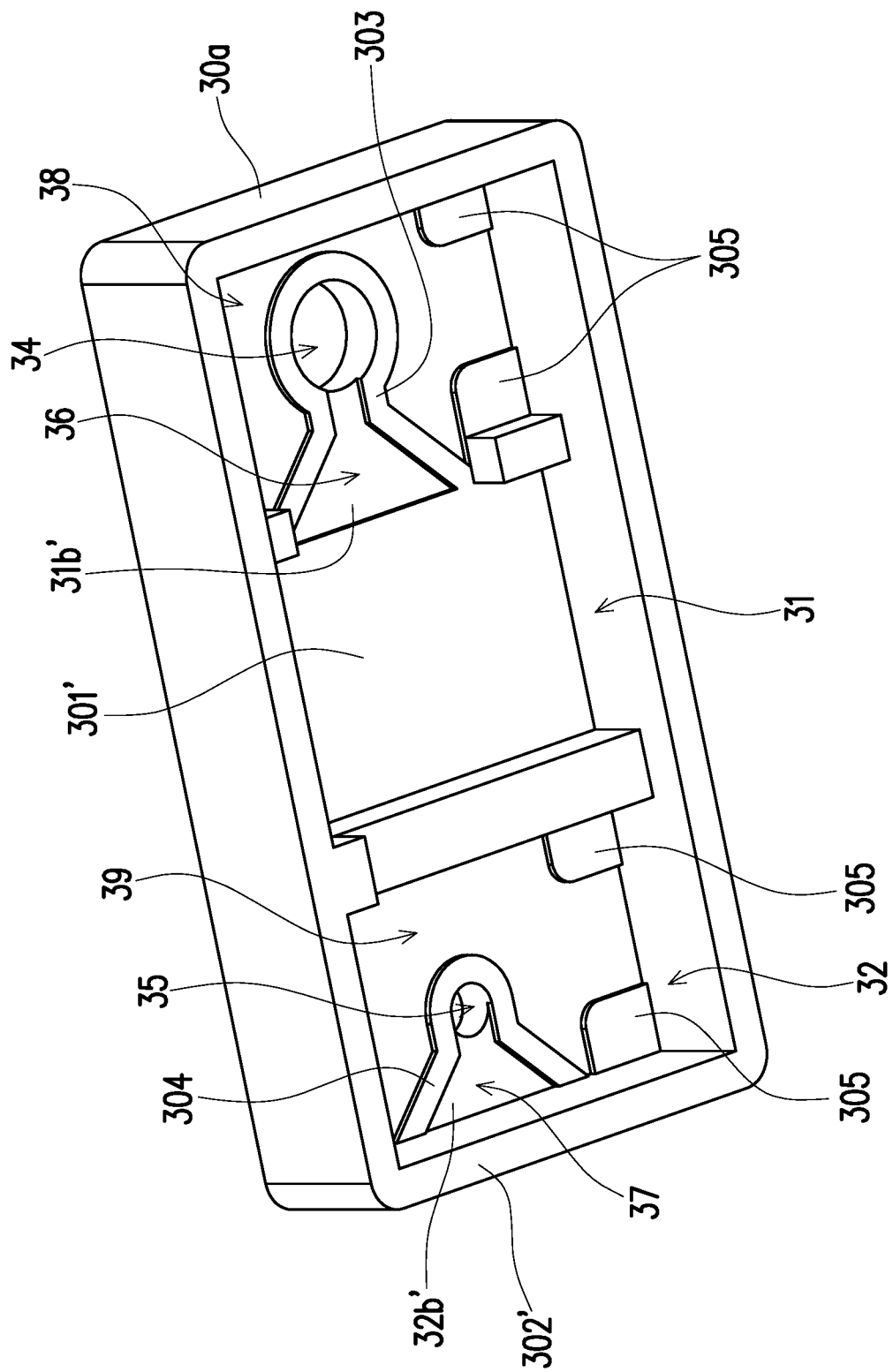
FIG. 6B is a schematic view of a covering member in FIG. 6A.

FIG. 6A is a schematic cross-sectional view of an optoelectronic module according to yet another embodiment of the disclosure. FIG. 6B is a schematic view of a covering member in FIG. 6A. Please refer to FIG. 6A and FIG. 6B, an optoelectronic module 10E of the embodiment has substantially the same design as the optoelectronic module 10 shown in FIG. 1A, and the difference between the two is that the inner wall surfaces, such as a fourth inner wall surface 32b' and a sixth inner wall surface 31b', of an upper cover portion 301' of a covering member 30a include a first groove 36 communicated with the first opening 34, a second groove 37 communicated with the second opening 35, wherein the first and second grooves 36, 37 constitute air vent. In addition, the covering member 30a further includes a first glue accommodating groove 38 and a second glue accommodating groove 39, wherein the first groove 36 and the first glue accommodating groove 38 are located in the first cavity 31, and the second groove 37 and the second glue accommodating groove 39 are located in the second cavity 32. In detail, the first glue accommodating groove 38 and the first opening 34 are separated through a first protrusion 303, and at the same time, the first glue accommodating groove 38 and the first groove 36 are separated through the first protrusion 303. In addition, the second glue accommodating groove 39 and the second opening 35 are separated through a second protrusion 304, and at the same time, the second glue accommodating groove 39 and the second groove 37 are separated through the second protrusion 304. In the embodiment, the shapes of the first groove 36 and the second groove 37 are slightly funnel-shaped, but the shape and the number are not limited thereto.

Please refer to FIG. 6A and FIG. 6B, during the process of attaching the first optical element 70 and the second optical element 80 to the inner wall surfaces, such as a fourth inner wall surface 32b' and a sixth inner wall surface 31b', of the upper cover portion 301' of the covering member 30a through glue, air may then be vented to the outside through the first groove 36 and the first opening 34, and the second groove 37 and the second opening 35 to reduce the pressure difference between the inside and the outside of the covering member 30a, which prevents the first optical element 70 and the second optical element 80 from being damaged under pressure. On the other hand, the glue before curing is squeezed by the first optical element 70 and the second optical element 80 to flow, so the first glue accommodating groove 38 and the second glue accommodating groove 39 may provide space for glue before curing to flow. In addition, the first glue accommodating groove 38 provides an increased volume for accommodating the glue, thereby improving the strength of the first optical element 70 adhered to the upper cover portion 301' of the covering member 30a through the glue. Similarly, the second glue accommodating groove 39 provides an increased volume for accommodating the glue, thereby improving the strength of the second optical element 80 adhered to the upper cover portion 301' of the covering member 30a through the glue. In addition, in the embodiment, preferably, the inner wall surfaces of the upper cover portion 301' of the covering member 30a are respectively formed with connecting portions 305 at four corners corresponding to the first optical element 70 and the second optical element 80. The connecting portions 305 are configured to flatly attach the first optical element 70 and the second optical element 80 to the inner wall surfaces of the upper cover portion 301' of the covering member 30a, respectively.

In summary, the first protruded-recessed structure is formed on the first inner wall surface of the inside partition located in the first cavity, which can prevent stray light from penetrating the inside partition from the first cavity where the light emitting element is located to enter the second cavity where the light receiving element/the main optical sensor region is located, thereby reducing optical crosstalk. On the other hand, the second protruded-recessed structure is formed on at least a portion of the inner wall surfaces of the second cavity, which can prevent stray light from being received by the light receiving element/the main optical sensor region after being reflected by the at least a portion of the inner wall surfaces. In addition, other traveling paths or other penetrating paths of stray light may be blocked or absorbed by adopting the radiation-filtering adhesive layer or the light shielding layer to greatly reduce the stray light being received by the light receiving element/the main optical sensor region. Therefore, the optoelectronic module of the disclosure can obtain a better signal-to-noise ratio, thereby having excellent sensing accuracy.

Finally, it should be noted that the above embodiments are only used to illustrate, but not to limit, the technical solutions of the disclosure. Although the disclosure has been described in detail with reference to the above embodiments, persons skilled in the art should understand that the technical solutions described in the above embodiments can still be modified or some or all of the technical features thereof can be equivalently replaced. However, the modifications or replacements do not cause the essence of the corresponding technical solutions to deviate from the scope of the technical solutions of the embodiments of the disclosure.

What is claimed is:

1. An optoelectronic module, comprising:
a substrate;
a covering member disposed on the substrate, the covering member comprising an upper cover portion, a peripheral sidewall portion connected to the upper cover portion, and an inside partition extending from the upper cover portion to the substrate and delimiting a first cavity and a second cavity, wherein the first cavity is separated from the second cavity;
a light emitting element, disposed on the substrate as corresponding to the first cavity; and
a light receiving element, disposed on the substrate as corresponding to the second cavity;
wherein the inside partition has a first inner wall surface located in the first cavity and a second inner wall surface located in the second cavity; and
wherein a first protruded-recessed structure is formed on the first inner wall surface and the first protruded-recessed structure is a periodic protruded and recessed structure.

2. The optoelectronic module according to claim 1, wherein the second cavity is defined by at least the second inner wall surface, a third inner wall surface opposite to the second inner wall surface and a fourth inner wall surface connected between the second inner wall surface and the third inner wall surface, and a second protruded-recessed structure is formed on at least one of the second inner wall surface, the third inner wall surface and the fourth inner wall surface.

3. The optoelectronic module according to claim 2, wherein the first cavity is defined by at least the first inner wall surface, a fifth inner wall surface opposite to the first inner wall surface and a sixth inner wall surface connected between the first inner wall surface and the fifth inner wall surface, and the fifth inner wall surface and the sixth inner wall surface are substantially smooth.

4. The optoelectronic module according to claim 3, wherein the first inner wall surface, the second inner wall surface, the third inner wall surface, and the fifth inner wall surface are substantially perpendicular to the substrate, and the fourth inner wall surface and the sixth inner wall surface are substantially parallel to the substrate.

5. The optoelectronic module according to claim 1, wherein the light receiving element is a single-photon avalanche diode (SPAD) sensor chip, comprising:
a main optical sensor region, located in the second cavity and configured to receive light emitted by the light emitting element toward an external object and reflected toward the main optical sensor region; and
a reference optical sensor region, located in the first cavity and disposed near the light emitting element.

6. The optoelectronic module according to claim 5, wherein the inside partition comprises a first section connecting the covering member and a second section located between the substrate and the first section, and a width of the first section is greater than a width of the second section.

7. The optoelectronic module according to claim 6, wherein the first section further comprises a protruded portion extended outwardly and located in the first cavity, wherein there is a gap between a bottom surface of the protruded portion and a top surface of the SPAD sensor chip, and the reference optical sensor region is within an orthographic projection area of the protruded portion on the substrate.

8. The optoelectronic module according to claim 5, wherein the first protruded-recessed structure further comprises a protruded portion located in the first cavity extending from the first inner wall surface of the inside partition, wherein there is a gap between a bottom surface of the protruded portion and a top surface of the SPAD sensor chip, and the reference optical sensor region is within an orthographic projection area of the protruded portion on the substrate.

9. The optoelectronic module according to claim 5, wherein at least a portion of end of the inside partition abuts against the SPAD sensor chip.

10. The optoelectronic module according to claim 5, further comprising:
a first light shielding layer, disposed between the inside partition and the SPAD sensor chip, and at least a portion of end of the inside partition is coupled to the SPAD sensor chip through the first light shielding layer.

11. The optoelectronic module according to claim 5, wherein an end of the inside partition comprises a recess facing the SPAD sensor chip, and the recess spans across the SPAD sensor chip to separate the main optical sensor region from the reference optical sensor region.

12. The optoelectronic module according to claim 11, further comprising:
a second light shielding layer, disposed between the inside partition, the SPAD sensor chip and the substrate, and a portion of the second light shielding layer is disposed in the recess.

13. The optoelectronic module according to claim 5, further comprising:
an adhesive layer, disposed between the SPAD sensor chip and the substrate, wherein the SPAD sensor chip is bonded to the substrate through the adhesive layer, wherein the adhesive layer is configured to block light in a specific wavelength range.

14. The optoelectronic module according to claim 13, wherein the adhesive layer covers side edge surfaces of the SPAD sensor chip.

15. The optoelectronic module according to claim 13, further comprising:
a second radiation-filtering adhesive layer, disposed on the substrate and covering side edge surfaces of the SPAD sensor chip and side edge surfaces of the adhesive layer.

16. The optoelectronic module according to claim 1, wherein the covering member comprises a first opening communicated with the first cavity and a second opening communicated with the second cavity, and the optoelectronic module further comprises a first optical element disposed in the first cavity and a second optical element disposed in the second cavity, wherein the first optical element covers the first opening, and the second optical element covers the second opening.

17. The optoelectronic module according to claim 16, further comprising:
a first radiation-filtering adhesive layer, attached to the fourth inner wall surface and covering side edge surfaces of the second optical element.

18. The optoelectronic module according to claim 16, wherein the second optical element comprises a first optical surface facing the second opening and a second optical surface opposite to the first optical surface, and at least one of the first optical surface and the second optical surface is a Fresnel optical surface.

19. The optoelectronic module according to claim 18, wherein one of the first optical surface and the second optical surface is a Fresnel optical surface, and other one of the first optical surface and the second optical surface comprises an optical coating layer.

20. The optoelectronic module according to claim 16, wherein the fourth inner wall surface and the sixth inner wall surface further comprise a first groove and a second groove respectively, wherein the first groove is communicated with the first opening, and the second groove is communicated with the second opening.

21. The optoelectronic module according to claim 20, wherein the fourth inner wall surface and the sixth inner wall surface further comprise a first glue accommodating groove and a second glue accommodating groove respectively, wherein the first glue accommodating groove, the first opening and the first groove are separated through a first protrusion, and the second glue accommodating groove, the second opening and the second groove are separated through a second protrusion.

22. An optoelectronic module, comprising:
a substrate;
a covering member, disposed on the substrate, the covering member comprising an inside partition delimiting a first cavity and a second cavity, wherein the first cavity is separated from the second cavity;
a light emitting element, disposed on the substrate as corresponding to the first cavity; and
a light receiving element, disposed on the substrate as corresponding to the second cavity;
wherein the inside partition has a first inner wall surface located in the first cavity and a second inner wall surface located in the second cavity; and
the second cavity is defined by at least the second inner wall surface, a third inner wall surface opposite to the second inner wall surface and a fourth inner wall surface connected between the second inner wall surface and the third inner wall surface, and a second protruded-recessed structure is formed on at least one of the second inner wall surface, the third inner wall surface and the fourth inner wall surface; and
wherein the second protruded-recessed structure is a periodic protruded and recessed structure.

23. An optoelectronic module, comprising:
a substrate;
a covering member disposed on the substrate, the covering member comprising an upper cover portion, a peripheral sidewall portion connected to the upper cover portion, and an inside partition extending from the upper cover portion to the substrate and delimiting a first cavity and a second cavity, wherein the first cavity is separated from the second cavity;
a light emitting element, disposed on the substrate as corresponding to the first cavity; and
a light receiving element, disposed on the substrate as corresponding to the second cavity, wherein the light receiving element comprises a main optical sensor region and a reference optical sensor region, the main optical sensor region is located in the second cavity and configured to receive light emitted by the light emitting element toward an external object and reflected toward the main optical sensor region, the reference optical sensor region is located in the first cavity and disposed near the light emitting element;

wherein the inside partition has a first inner wall surface located in the first cavity and a second inner wall surface located in the second cavity; and wherein a first protruded-recessed structure is formed on the first inner wall surface, and the first protruded-recessed structure further comprises a protruded portion located in the first cavity extending from the first inner wall surface of the inside partition, wherein there is a gap between a bottom surface of the protruded portion and a top surface of the light receiving element, and the reference optical sensor region is within an orthographic projection area of the protruded portion on the substrate.

* * * * *